(12) United States Patent
Xiao et al.

(10) Patent No.: US 12,274,105 B2
(45) Date of Patent: Apr. 8, 2025

(54) LEADFRAME, BRACKET AND LED DEVICE

(71) Applicant: APT ELECTRONICS CO., LTD., Guangdong (CN)

(72) Inventors: Guowei David Xiao, Guangdong (CN); Chuiming Wan, Guangdong (CN); Zhaoming Zeng, Guangdong (CN); Yu Hou, Guangdong (CN); Wenmin Zhu, Guangdong (CN); Yian Lan, Guangdong (CN)

(73) Assignee: APT ELECTRONICS CO., LTD., Guangdong (CN)

( * ) Notice: Subject to any disclaimer, the term of this patent is extended or adjusted under 35 U.S.C. 154(b) by 636 days.

(21) Appl. No.: 17/763,679

(22) PCT Filed: Oct. 21, 2019

(86) PCT No.: PCT/CN2019/112241
§ 371 (c)(1),
(2) Date: Jun. 16, 2022

(87) PCT Pub. No.: WO2021/056644
PCT Pub. Date: Apr. 1, 2021

(65) Prior Publication Data
US 2023/0011594 A1 Jan. 12, 2023

(30) Foreign Application Priority Data
Sep. 25, 2019 (CN) .......................... 201910911576.6

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H10H 20/856* (2025.01); *H10H 29/0364* (2025.01)

(58) Field of Classification Search
None
See application file for complete search history.

(56) References Cited

U.S. PATENT DOCUMENTS

| | | | |
|---|---|---|---|
| 2016/0380171 A1* | 12/2016 | Lin | H10D 30/6708 257/98 |
| 2018/0175252 A1* | 6/2018 | Naka | A61K 40/405 |
| 2019/0115504 A1 | 4/2019 | Naka et al. | |

FOREIGN PATENT DOCUMENTS

| | | |
|---|---|---|
| CN | 101834265 A | 9/2010 |
| CN | 102142513 A | 8/2011 |

(Continued)

OTHER PUBLICATIONS

International Search Report issued by the China National Intellectual Property Administration acting as the International Searching Authority in relation to International Application No. PCT/CN2019/112241 dated Jun. 28, 2020 (6 pages), including English translation.
(Continued)

*Primary Examiner* — Feifei Yeung Lopez
(74) *Attorney, Agent, or Firm* — Robert P. Michal, Esq.; Carter, DeLuca & Farrell LLP

(57) ABSTRACT

Disclosed are a leadframe, a bracket and an LED device. The leadframe includes a first photo-etched metal part, having a first electrode and a chip placement layer thereon, which has a greater length for short and long edges than those of the first electrode; and a second photo-etched metal part, composed of a second electrode and a connection layer thereon, which has a greater length for short and long edges than those of the second electrode; wherein a first long edge of the chip placement layer is flush with a first long edge of the
(Continued)

first electrode, and a first long edge of the connection layer is flush with a first long edge of the second electrode; and wherein the chip placement layer and the connection layer are provided with L-shaped pins at corners of their first long edges to cover sidewalls of the corresponding corners.

20 Claims, 9 Drawing Sheets

(51) Int. Cl.
*H10H 20/856* (2025.01)
*H10H 29/01* (2025.01)

(56) References Cited

FOREIGN PATENT DOCUMENTS

| CN | 104037297 A | 9/2014 |
| CN | 105938866 A | 9/2016 |

OTHER PUBLICATIONS

Written Opinion of the International Searching Authority issued by the China National Intellectual Property Administration acting as the International Searching Authority in relation to International Application No. PCT/CN2019/112241 dated Jun. 28, 2020 (3 pages).

* cited by examiner

LEADFRAME, BRACKET AND LED DEVICE

CROSS-REFERENCE TO RELATED APPLICATIONS

This application claims priority to PCT Application No. PCT/CN2019/112241, having a filing date of Oct. 21, 2019 based on Chinese application No. 201910911576.6 having a filing date of Sep. 25, 2019, the entire contents of foresaid documents are hereby incorporated by reference.

TECHNICAL FIELD

The following relates to the field of LED technology, and particularly to a leadframe, a bracket and an LED device.

BACKGROUND

In the current technical field of LED, a bracket for packaging an LED chip is generally comprised of a leadframe and a reflector cup. As shown in FIG. 1, an existing leadframe is generally etched into a first electrode 101 and a second electrode 102 separated from each other through a total etching process, and an isolation trench 103 is formed between the first electrode 101 and the second electrode 102. Meanwhile, for connecting a single leadframe to an adjacent one, the first electrode 101 and the second electrode 102 of the leadframe are respectively provided with pins 104 at their long edges away from the isolation trench 103 and at short edges thereof.

However, to avoid short-circuiting when the first electrode 101 and the second electrode 102 are connected externally, the isolation trench 103 is generally designed to have a larger width. Since the isolation trench 103 occupies a certain area of the leadframe, the area of the placement zone for placing the LED chip on the first electrode 100 is relatively small and only one LED chip with a smaller light-emitting area may be accommodated, resulting in a low luminance of the LED device. Additionally, since the pins 104 are generally provided in the middle of the above-mentioned edges and have an extremely small width, the leadframes are connected to small stress and low strength, which causes the edges of the leadframes to deform easily in the subsequent process and further renders deviations in the injection molding process. Therefore, the hermeticity of the bracket and the LED device employing the leadframe is reduced, and their service lives are also reduced.

SUMMARY

An aspect relates to a leadframe, a bracket and an LED device, which improve the luminance, hermeticity, and service life of the LED device.

To solve the above technical problem, the present disclosure provides a leadframe, comprising
a first photo-etched metal part, composed of a first electrode and a chip placement layer stacked thereon, wherein the chip placement layer comprises a first placement zone and a second placement zone connected to each other; wherein the first placement zone has a greater length than that of the second placement zone; wherein a first end of the first placement zone is flush with a first end of the second placement zone so as to together become a first long edge of the chip placement layer; wherein a second end of the first placement zone and a second end of the second placement zone together become a second edge of the chip placement layer; and wherein the chip placement layer has a greater length for long edges and a greater length for short edges than those of the first electrode; and
a second photo-etched metal part, composed of a second electrode and a connection layer stacked thereon, wherein the connection layer has a greater length for long edges and a greater length for short edges than those of the second electrode;
wherein the first long edge of the chip placement layer is flush with a first long edge of the first electrode and a first long edge of the connection layer is flush with a first long edge of the second electrode, so that a first isolation trench is formed between the first electrode and the second electrode, and a second isolation trench is formed between the chip placement layer and the connection layer; and
wherein the chip placement layer 12 and the connection layer 22 are respectively provided with L-shaped pins 41 at corners of their respective first long edges to cover sidewalls of the corresponding corners.

In an improved embodiment, an upper surface and/or a lower surface of each of the L-shaped pins 41 are roughened.

In an improved embodiment, the second end of the first placement zone is smoothly connected with the second end of the second placement zone at a corner.

In an improved embodiment, the connection layer at its first edge is provided with a third protruding part, which is matched with the second edge of the chip placement layer, so that a Zener diode can be placed at the third protruding part.

In an improved embodiment, a first receiving section is provided at the second end of the first placement zone and a second receiving section is provided at the second end of the second placement zone; the first receiving section and the second receiving section are incorporated in an unaligned manner to jointly form a chip receiving zone; and
a first groove is provided around the chip receiving zone along a whole periphery, except an edge next to the second isolation trench, and is filled with white EMC (Epoxy molding compound) material to form a reflective wall.

In an improved embodiment, the first receiving section includes a first protruding part, provided at one end of the first receiving section adjacent to the second isolation trench; and the second receiving section includes a second protruding part, provided at one end of the second receiving section remote from the second isolation trench.

In an improved embodiment, the first groove is composed of a first segment of groove and a second segment of groove; the first segment of groove is provided around a long edge and a short edge of the first receiving section as well as a short edge of the second receiving section, while the second segment of groove is provided along a long edge of the second receiving section; a first end of the first segment of groove is in connection with the second isolation trench, while a second end of the first segment of groove intersects with a first end of the second segment of groove, and an outer corner of the first segment of groove at the second end thereof is connected to an inner corner of the second segment of groove at the first end thereof; and the first segment of groove is filled with white EMC material to form a first reflective wall and the second segment of groove is filled with white EMC material to form a second reflective wall.

An aspect relates to a bracket, which includes any an above-mentioned leadframe, wherein the first isolation trench and the second isolation trench are both filled with EMC material to respectively form a first insulation trench and a second insulation trench; wherein a reflector cup is provided around the leadframe, and a bottom thereof covers sidewalls of the leadframe and is flush with bottoms of the first electrode and the second electrode.

An aspect relates to a bracket, which includes any an above-mentioned leadframe, wherein the first isolation trench, the second isolation trench and the first groove are all filled with white EMC material to respectively form a first insulation trench, a second insulation trench and a reflective wall, and a first reflector cup is formed by the second insulation trench and the reflective wall.

In an improved embodiment, a second reflector cup is provided around the leadframe, and a bottom thereof covers sidewall of the leadframe and is flush with bottoms of the first electrode and the second electrode.

In an improved embodiment, the second reflector cup is located outside of the first reflector cup; and a second groove is formed between the first reflector cup and the second reflector cup for filling with white EMC material so as to form a reflective layer.

In an improved embodiment, a top of the first reflector cup is square, semi-circle or dome-shaped, and there is a height difference of 60 μm~120 μm between the top of the first reflector cup and a top of the first photo-etched metal part.

An aspect relates to an LED device, which includes two LED chips and a first type of above-mentioned brackets, wherein the two LED chips are arranged in the first placement zone and the second placement zone, respectively.

An aspect relates to an LED device, which includes two LED chips and a second type of above-mentioned brackets, wherein the two LED chips are arranged in the first receiving section and the second receiving section, respectively.

Compared to the prior art, the leadframe, the bracket and the LED device according to the present disclosure are implemented with the following advantageous effects. It is noted that a first photo-etched metal part is composed of a first electrode and a chip placement layer stacked thereon, wherein the chip placement layer comprises a first placement zone and a second placement zone connected to each other; wherein the first placement zone has a greater length than that of the second placement zone; wherein a first end of the first placement zone is flush with a first end of the second placement zone so as to become a first long edge of the chip placement layer; and a second end of the first placement zone and a second end of the second placement zone together become a second edge of the chip placement layer. Thus, the first placement zone and the second placement zone are arranged in an unaligned manner, thereby improving area utilization rate of the chip placement layer. Besides, the chip placement layer has a greater length for long edges and a greater length for short edges than those of the first electrode; and a second photo-etched metal part is composed of a second electrode and a connection layer stacked thereon, wherein the connection layer has a greater length for long edges and a greater length for short edges than those of the second electrode; wherein a first long edge of the chip placement layer is flush with a first long edge of the first electrode, and a first long edge of the connection layer is flush with a first long edge of the second electrode so that a first isolation trench is formed between the first electrode and the second electrode, and a second isolation trench is formed between the chip placement layer and the connection layer. In this manner, the chip placement layer is designed to have a chip placement zone which can accommodate two LED chips, by reducing the area of the second isolation trench between the chip placement layer and the connection layer. Thus the chip placement layer 12 can be designed to have a larger area, so that the leadframe may accommodate an LED chip with a larger light-emitting area so as to improve the luminance of an LED device employing such leadframe. On the other hand, since the first isolation trench of the leadframe between the first electrode and the second electrode is configured to be identical in width and area to those in the prior art, the leadframe can be prevented from short-circuiting when connected externally, and can also be compatible with the electrodes of the existing bracket. In addition, since the chip placement layer and the connection layer at the corresponding corners of their respective first long edges are respectively provided with L-shaped pins, inside walls of which may cover sidewalls of the corresponding corners. Hence, L-shaped pins capable of connecting to an adjacent leadframe are formed at the four corners of the leadframe and they have a relative large connecting area to effectively enhance the connecting strength and stress of the leadframes therebetween, which will prevent the leadframes from deforming in the subsequent process, and further avoid deviations in the subsequent injection molding process. Thus the hermeticity and service lives of the bracket and the LED device employing the leadframe can be improved. Meanwhile, the L-shaped pins are only provided at the corners of their first long edges of the chip placement layer and the connection layer, and they are half-etched to have a thinner thickness than those in the existing leadframes, thereby reducing the wear and tear of the cutter for cutting the L-shaped pins in the subsequent cutting process.

BRIEF DESCRIPTION OF THE DRAWINGS

FIG. 7 (b) is a sectional view of the bracket shown in FIG. 5 along the section line B1-B2.

FIG. 7 (c) is a sectional view of the bracket shown in FIG. 5 along the section line A1-A2.

FIG. 7 (d) is a sectional view of the bracket shown in FIG. 5 along the section line B1-D.

FIG. 7 (e) is a sectional view of the bracket shown in FIG. 5 along the section line C1-C2.

DETAILED DESCRIPTION OF EMBODIMENTS

In the following description, numerous specific details are set forth to facilitate a thorough understanding of the present disclosure. However, the present disclosure may be implemented in many other ways than the one described herein, and those skilled in the art may make similar extensions without departing from the spirit and scope of the present disclosure. Accordingly, the present disclosure is not intended to be limited to the specific embodiments disclosed below.

The present disclosure will be clearly and fully described hereinafter with reference to embodiments and the accompanying drawings.

Figure 1:
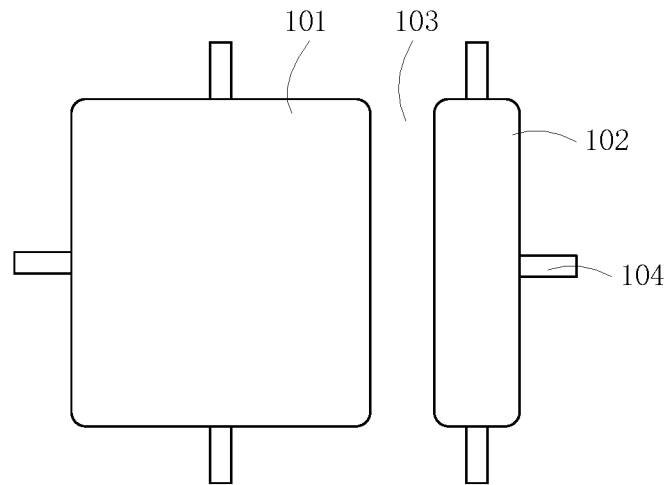
FIG. 1 is a structural schematic diagram of a leadframe in the prior art.
Figure 2:
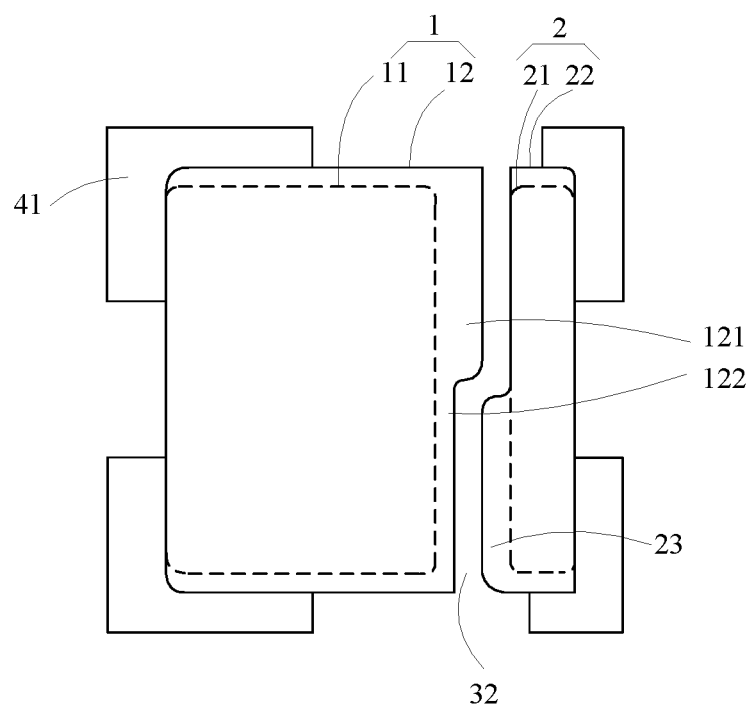
FIG. 2 is a structural schematic diagram of a leadframe according to Embodiment 1 of the present disclosure.

FIG. 2 is a structural schematic diagram of a leadframe according to Embodiment 1 of the present disclosure.

As shown in FIG. 2, the leadframe includes
- a first photo-etched metal part 1, composed of a first electrode 11 and a chip placement layer 12 stacked thereon, wherein the chip placement layer 12 includes a first placement zone 121 and a second placement zone 122 connected to each other; wherein the first placement zone 121 has a greater length than that of the second placement zone 122; wherein a first end of the first placement zone 121 is flush with a first end of the second placement zone 122 so as to become a first long edge of the chip placement layer 12; wherein a second end of the first placement zone 121 and a second end of the second placement zone 122 together become a second edge of the chip placement layer 12; and wherein the chip placement layer 12 has a greater length for long edges and a greater length for short edges than those of the first electrode 11; and
- a second photo-etched metal part 2, composed of a second electrode 21 and a connection layer 22 stacked thereon, wherein the connection layer 22 has a greater length for long edges and a greater length for short edges than those of the second electrode 21;
- wherein the first long edge of the chip placement layer 12 is flush with a first long edge of the first electrode 11, and a first long edge of the connection layer 22 is flush with a first long edge of the second electrode 21, so that a first isolation trench is formed between the first electrode 11 and the second electrode 21; wherein a second isolation trench 32 is formed between the chip placement layer 12 and the connection layer 22; and wherein the chip placement layer 12 and the connection layer 22 are respectively provided with L-shaped pins 41 at corners of their respective first long edges to cover sidewalls of the corresponding corners.

With regard to the leadframe in the present embodiment, it is noted that the first photo-etched metal part 1 is composed of a first electrode 11 and a chip placement layer 12 stacked thereon. The chip placement layer 12 includes the first placement zone 121 and the second placement zone 122 connected to each other. The first placement zone 121 has a greater length than that of the second placement zone 122. The first end of the first placement zone 121 is flush with the first end of the second placement zone 122 so as to become the first long edge of the chip placement layer 12; meanwhile, the second end of the first placement zone 121 and the second end of the second placement zone 122 together become the second edge of the chip placement layer 12, so that the first placement zone 121 and the second placement zone 122 are arranged in an unaligned manner, and thus the area utilization rate of the chip placement layer 12 is improved. The chip placement layer 12 has a greater length for long edges and a greater length for short edges than those of the first electrode 11. The second photo-etched metal part 2 is composed of the second electrode 21 and the connection layer 22 stacked thereon, wherein the connection layer 22 has a larger length for long edges and a larger length for short edges than those of the second electrode 21. The first long edge of the chip placement layer 12 is flush with the first long edge of the first electrode 11, and the first long edge of the connection layer 22 is flush with the first long edge of the second electrode 21, so that the first isolation trench is formed between the first electrode 11 and the second electrode 21, and the second isolation trench 32 is formed between the chip placement layer 12 and the connection layer 22. In this manner, the chip placement layer 12 is designed to have a chip placement zone which can accommodate two LED chips, by reducing the area of the second isolation trench 32 between the chip placement layer 12 and the connection layer 22. Thus the chip placement layer 12 can be designed to have a larger area, so that the leadframe may accommodate an LED chip with a larger light-emitting area so as to improve the luminance of an LED device employing such leadframe. On the other hand, since the first isolation trench of the leadframe between the first electrode 11 and the second electrode 21 is configured to be identical in width and area to those in the prior art, the leadframe can be prevented from short-circuiting when connected externally, and can also be compatible with the electrodes of the existing leadframes. Furthermore, since the chip placement layer 12 and the connection layer 22 at the corresponding corners of their respective first long edges are respectively provided with the L-shaped pins 41, inside walls of which may cover sidewalls of the corresponding corners. In this way, the L-shaped pins 41 capable of connecting to the adjacent leadframes are formed at the four corners of the leadframe, and have a relative large connection area to effectively enhance the connection strength and stress of the leadframes therebetween, which will prevent the leadframes from deforming in the subsequent process and further avoid a deviation in the subsequent injection molding process. Thus the hermeticity and service lives of a bracket and an LED device employing such leadframe may be improved. Meanwhile, the L-shaped pins 41 are only provided at the corners of their respective first long edges of the chip placement layer 12 and connection layer 22, and the L-shaped pins 41 are half-etched to have a thinner thickness than those in the existing leadframes, thereby reducing the wear and tear of the cutter for cutting the L-shaped pins 41 in the subsequent cutting process.

Preferably, an upper surface and/or a lower surface of each of the L-shaped pins 41 are roughened, and may be corrugated, convex, concave or irregular in shape. In this way, the bonding force between the reflector cup and the leadframe may be increased, and the entry path of gas going through the junctions between the reflector cup and the leadframe may be lengthened to further improve the hermeticity of the bracket and the LED device employing such leadframe.

Preferably, in the present embodiment, the second end of the first placement zone 121 is smoothly connected with the second end of the second placement zone 122 at a corner, so that white EMC (Epoxy molding compound) material may be uniformly filled in the second isolation trench 32 to form a second insulation trench.

Figure 3:
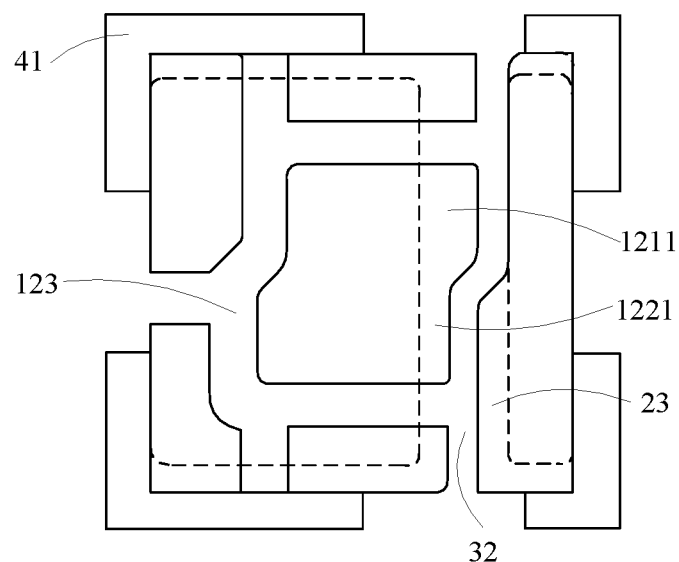
FIG. 3 is a structural schematic diagram of a leadframe according to Embodiment 2 of the present disclosure.

FIG. 3 is a structural schematic diagram of a leadframe according to Embodiment 2 of the present disclosure.

As shown in FIG. 3, in addition to all the components described above, the leadframe further includes a first receiving section 1211 provided at the second end of the first placement zone 121 and a second receiving section 1221 provided at the second end of the second placement zone 122. The first receiving section 1211 and the second receiving section 1221 are incorporated in an unaligned manner to jointly form a chip receiving zone. A first groove 123 is provided around the chip receiving zone along the whole periphery, except the edge next to the second isolation trench 32. The first groove 123 is filled with white EMC material to form a reflective wall.

In this embodiment, since the first receiving section 1211 is provided at the second end of the first placement zone 121, while the second receiving section 1221 is provided at the second end of the second placement zone 122, and the first receiving section 1211 and the second receiving section 1221 are further arranged at the junction of the first placement zone 121 and the second placement zone 122, the first receiving section 1211 and the second receiving section 1221 are incorporated in an unaligned manner to jointly form a chip receiving zone. Thus the chip receiving zone facilitates receiving two unaligned LED chips, which may be adjacent to each other, thereby improving the utilization rate of the chip placement layer 12. In this way, there is enough space spared to arrange the first groove 123 around the chip receiving zone along the whole periphery, except the edge next to the second isolation trench 32. Each end of the first groove 123 is connected to the corresponding end of the second isolation trench 32, so that the first groove 123 and the second isolation trench 32 together surround the chip receiving zone. Thus, the first groove 123 and the second isolation trench 32 are both filled with the white EMC material to respectively form the reflective wall and a second insulation trench, which together constitute a first reflector cup. Thus the luminous intensity and luminous efficiency of the LED device employing this leadframe are effectively improved.

In this embodiment, each of two ends of the first receiving section 1211 is in smooth connection with the corresponding end of the second receiving section 1221 so as to form two smooth bends at the edges of the chip receiving zone formed by the first receiving section 1211 and the second receiving section 1221, so that the white EMC material may be uniformly filled in the first groove 123. In this way, the utilization rate of the chip placement layer 12 is improved. Further, not only the placement areas for placing the LED chips are increased, but also there is still some space spared to form the first groove 123 with a uniform width, therefore the consistency of the luminous intensity and luminous efficiency of the LED device are improved by employing the reflective wall formed by the first groove 123.

Figure 4:
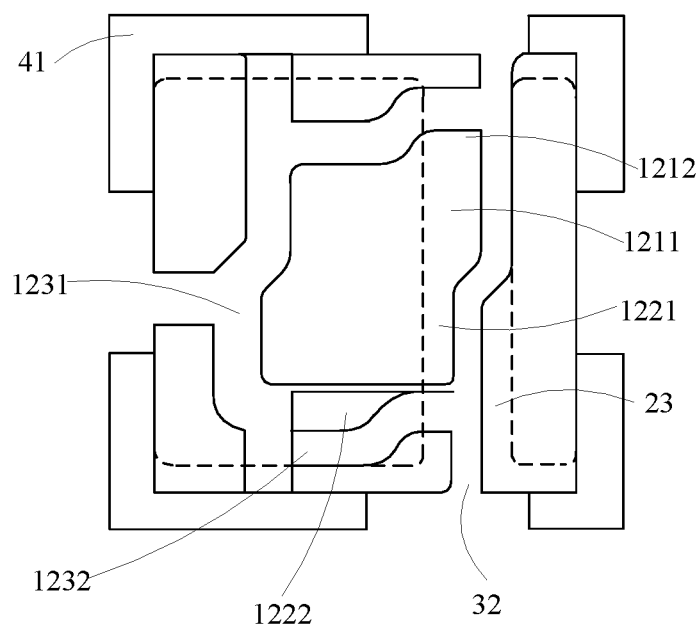
FIG. 4 is a structural schematic diagram of a leadframe according to Embodiment 3 of the present disclosure.

FIG. 4 is a structural schematic diagram of a leadframe according to Embodiment 3 of the present disclosure.

As shown in FIG. 4, the leadframe includes all the components described above. In addition, the first receiving section 1211 may further include a first protruding part 1212, which is provided at an end of the first receiving section 1211 adjacent to the second isolation trench 32. And the second receiving section 1221 may include a second protruding part 1222, which is provided at an end of the second receiving section 1221 remote from the second isolation trench 32.

The first groove 123 is composed of a first segment of groove 1231 and a second segment of groove 1232. The first segment of groove 1231 is provided around a long edge and a short edge of the first receiving section 1211 as well as a short edge of the second receiving section 1221, while the second segment of groove 1232 is provided along a long edge of the second receiving section 1221. A first end of the first segment of groove 1231 is in communication with the second isolation trench 32, w % bile a second end of the first segment of groove 1231 intersects with a first end of the second segment of groove 1232, and an outer corner of the first segment of groove 1231 at its second end is connected to an inner corner of the second segment of groove 1232 at its first end. The first segment of groove 1231 is filled with white EMC material to form a first reflective wall, while the second segment of groove 1232 is filled with white EMC material to form a second reflective wall. In this manner, the first segment of groove 1231, the second segment of groove 1232 and the second isolation trench 32 jointly surround the chip receiving zone, and are all filled with white EMC material to together form a first reflector cup.

Provided is a bracket made by employing the above-mentioned leadframe. The bracket includes any one of the above-mentioned leadframes, wherein the first isolation trench and the second isolation trench 32 are both filled with EMC material to form a first insulation trench and a second insulation trench respectively. A reflector cup is provided around the leadframe, and a bottom of the reflector cup covers sidewalls of the leadframe and is flush with bottoms of the first electrode 11 and the second electrode 21.

The brackets employing the leadframes of Embodiments 2 and 3 are taken as examples for illustrating their structures in detail below.

Figure 5:
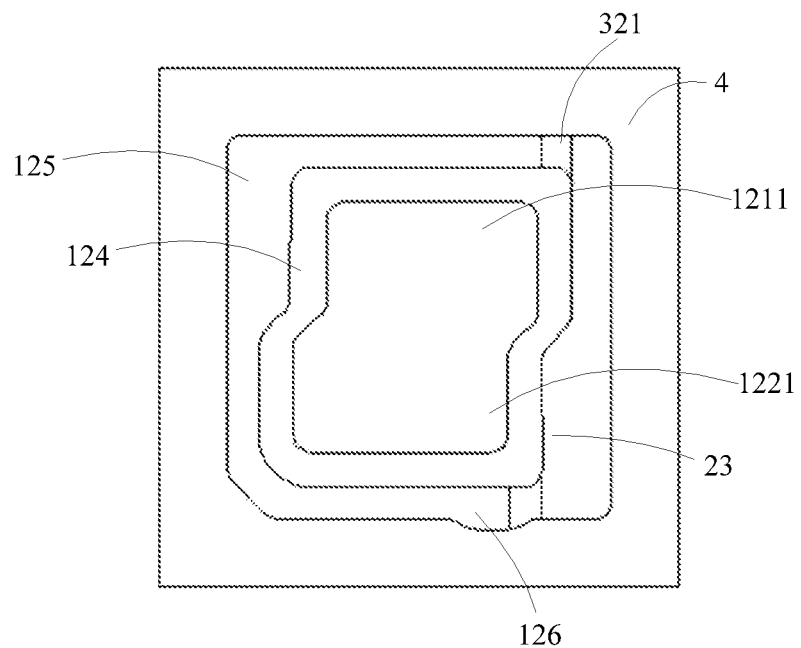
FIG. 5 is a structural schematic diagram of a bracket according to Embodiment 4 of the present disclosure.
Figure 6:
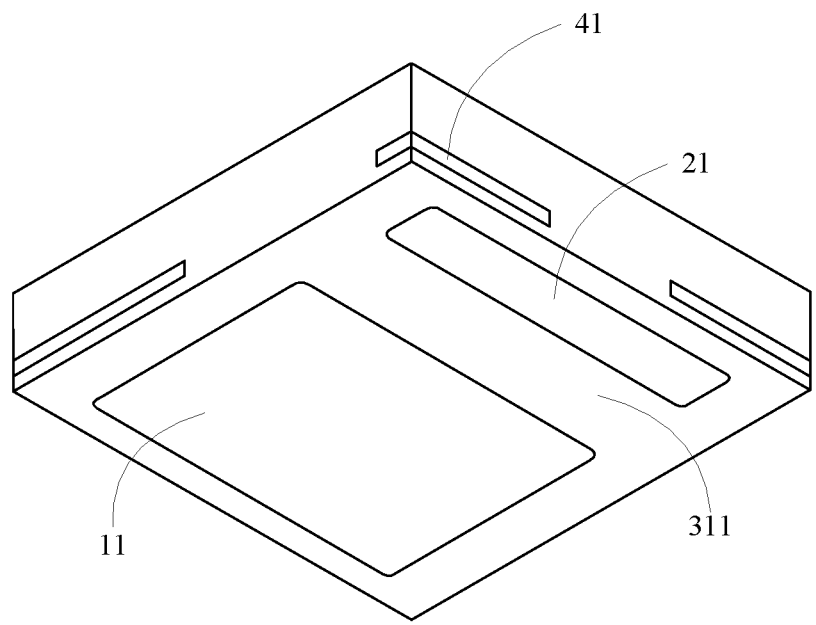
FIG. 6 is a perspective view of a bracket according to one embodiment of the present disclosure.
Figure 7A:
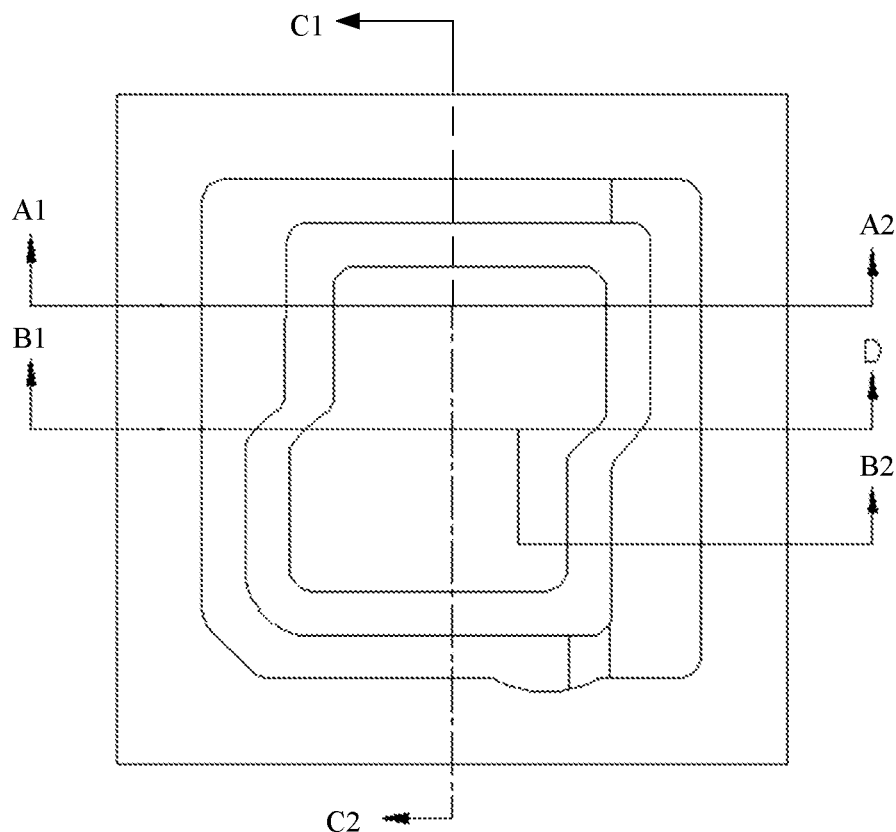
FIG. 7 (a) is a schematic diagram of the bracket shown in FIG. 5, showing the section lines A1-A2, B1-B2, B1-D, and C1-C2.
Figure 7B:
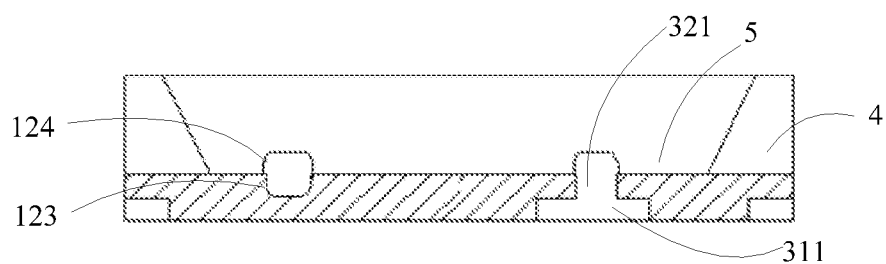
Figure 7C:
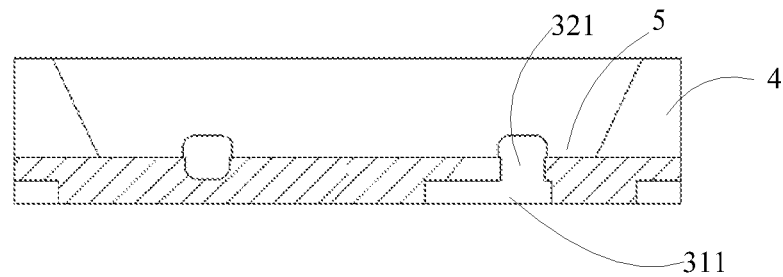
Figure 7D:
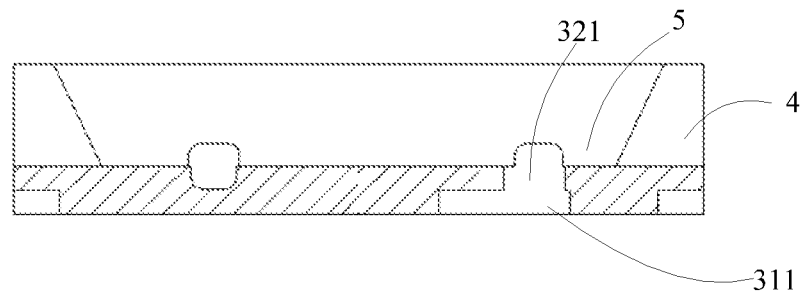
Figure 7E:
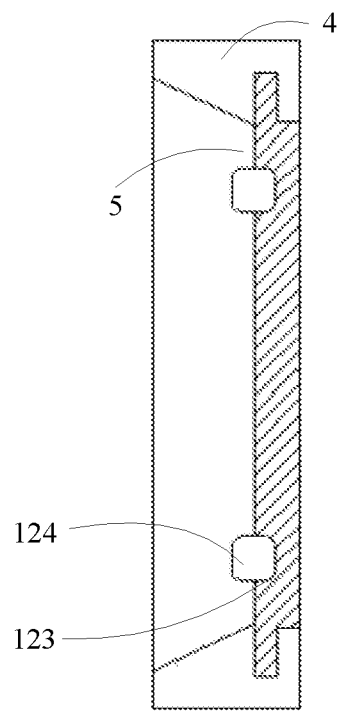

FIG. 5 is a structural schematic diagram of a bracket according to Embodiment 4 of the present disclosure.

As shown in FIGS. 3 and 5-7, the bracket includes the leadframe of the above-mentioned Embodiment 2, wherein the first isolation trench and the second isolation trench 32 are both filled with white EMC material to respectively form a first insulation trench 311 and a second insulation trench 321. The first groove 123 is filled with white EMC material to form a reflective wall 124, which is connected to the second insulation trench 321 at both ends. Thus the reflective wall 124 and the second isolation trench 32 together form a first reflector cup. In addition, a second reflector cup 4 is provided around the leadframe, and a bottom of the second reflector cup 4 covers sidewalls of the leadframe and is flush with bottoms of the first electrode 11 and the second electrode 21. Thus, the L-shaped pins 41 in the leadframe are embedded into walls of the second reflector cup 4 to enhance the connection strength between the second reflector cup 4 and the leadframe; besides, the path of gas entering the bracket through junctions of the leadframe may be lengthened, thereby improving the hermeticity of the bracket.

Preferably, the second reflector cup 4 is arranged outside the first reflector cup. A second groove 5 is formed between the first reflector cup and the second reflector cup 4 for filling with white EMC material so as to form a reflective layer. In this way, the light reflection efficiency of the LED device employing the bracket can be further enhanced and its luminance can also be improved.

Preferably, a top of the first reflector cup is square, semi-circle, or dome-shaped, and there is a height difference of 60 μm~120 μm between the top of the first reflector cup and the top of the first photo-etched metal part 1.

Figure 8:
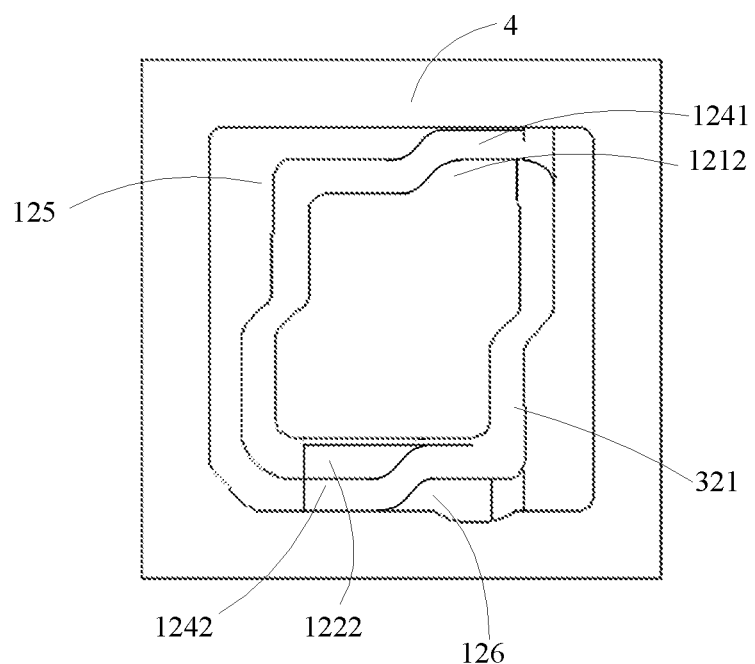
FIG. 8 is a structural schematic diagram of a bracket according to Embodiment 5 of the present disclosure.
Figure 9:
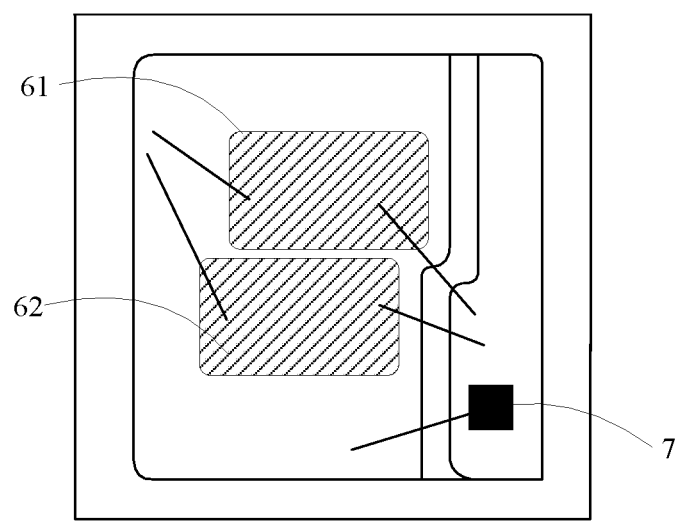
FIG. 9 is a structural schematic diagram of an LED device according to Embodiment 6 of the present disclosure.
Figure 10:
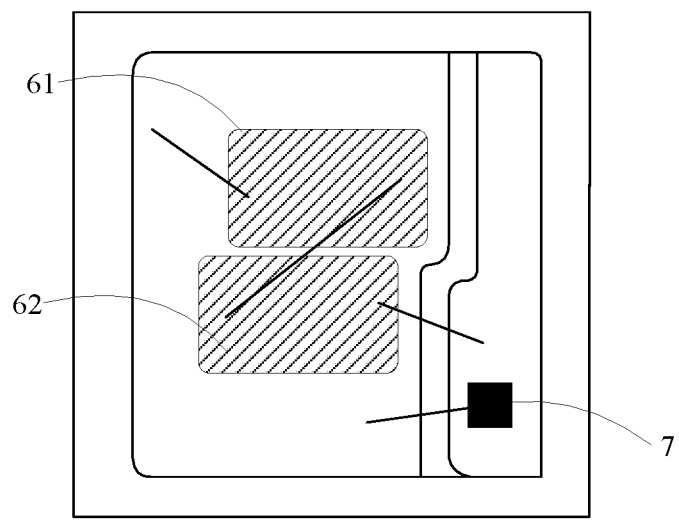
FIG. 10 is a structural schematic diagram of an LED device according to Embodiment 7 of the present disclosure.

FIG. 8 is a structural schematic diagram of a bracket according to Embodiment 5 of the present disclosure.

As shown in FIGS. 4 and 8, the bracket includes the leadframe of the above-mentioned Embodiment 3, wherein the first isolation trench and the second isolation trench 32 are both filled with white EMC material to respectively form a first insulation trench 311 and a second insulation trench 321. The first segment of groove 1231 and the second segment of groove 1232 of the first groove 123 are both filled with white EMC material to respectively form a first reflective wall 1241 and a second reflective wall 1242. The first reflective wall 1241 is connected to the second insulation trench 321 at a first end, while the second reflective wall 1242 is connected to the second insulation trench 321 at a second end. Meanwhile, a second end of the first reflective wall 1241 is connected to a first end of the second reflective wall 1242. Thus, the first reflective wall 1241, the second reflective wall 1242 and the second isolation trench 32 together form a first reflector cup. In addition, a second reflector cup 4 is provided around the leadframe, and a bottom of the second reflector cup 4 covers sidewalls of the leadframe and is flush with bottoms of the first electrode 11 and the second electrode 21.

Preferably, in the above-mentioned embodiment, the connection layer 22 at its first edge is provided with a third protruding part 23, which is matched with the second edge of the chip placement layer 12. Thus, at the end of the connection layer 22, wire bonding can be performed and Zener diodes can be placed. Further, the chip placement layer 12 includes a Zener connection layer 126, which is provided between the first reflector cup and the second reflector cup 4 and is close to the third protruding part 23. Since the area of the chip placement layer 12 in the first photo-etched metal part 1 is increased by reducing the area of the second insulation trench 321, a sufficient spare space may be obtained for wire bonding of the Zener diode, by providing the Zener connection layer 126. In addition, the Zener connection layer 126 is close to the third protruding part 23, which facilitates performing the wire bonding and shortens the distance of wire bonding.

Preferably, in this embodiment, the chip placement layer 12 further includes a fourth protruding part 125, which is provided between the first reflector cup and the second reflector cup 4, and is close to the first receiving section 1211. Thus a spare space is spared for the wire bonding.

FIGS. 9-14 are structural schematic diagrams of LED devices according to embodiments of the present disclosure.

As shown in FIGS. 2 and 9-14, the LED device includes two LED chips and any a bracket mentioned above, wherein a first LED chip 61 of the two LED chips is arranged in the first placement zone 121 and a second LED chip 62 of the two LED chips is arranged in the second placement zone 122.

When the first LED chip 61 and the second LED chip 62 are connected in parallel, a first end of the first LED chip 61 and a first end of the second LED chip 62 are respectively in connection with the chip placement layer 12 to further connect with the first electrode 11; and a second end of the first LED chip 61 and a second end of the second LED chip 62 are respectively in connection with the connection layer 22 to further connect with the second electrode 21.

When the first LED chip 61 and the second LED chip 62 are connected in series, a first end of the first LED chip 61 is connected to the chip placement layer 12 to further connect to the first electrode 11; then a second end of the first LED chip 61 is connected with a first end of the second LED chip 62; and then a second end of the second LED chip 62 is connected to the connection layer 22 to further connect to the second electrode 21.

Preferably, the LED device further includes a Zener diode 7, which is provided on the connection layer 22, wherein a first end of the Zener diode 7 is connected to the connection layer 22 to further connect to the second electrode 21, while a second end of the Zener diode 7 is connected to the chip placement layer 12 to further connect to the first electrode 11. In this manner, the LED device is prevented from reverse breakdown.

When a bracket having a first reflector cup and a second reflector cup described in the embodiment above is employed to produce an LED device, the LED device includes two LED chips, which are arranged in the first placement zone 121 and the second placement zone 122, respectively. Further, the second groove 5 is filled with a white light-reflecting layer, and a fluorescent layer is coated on an inner side of the first reflector cup, on the two LED chips, and on the white light-reflecting layer.

Further, an LED device employing the bracket shown in FIG. 5 is taken as an example to describe such a type of LED devices in detail.

Figure 11:
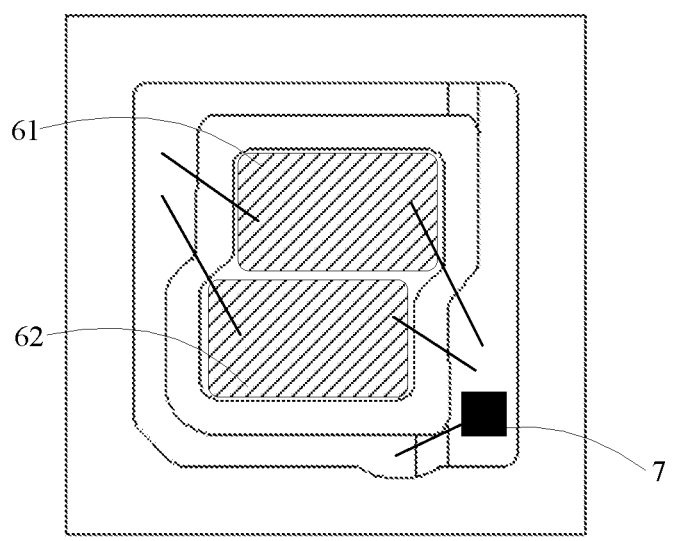
FIG. 11 is a structural schematic diagram of an LED device according to Embodiment 8 of the present disclosure.
Figure 12:
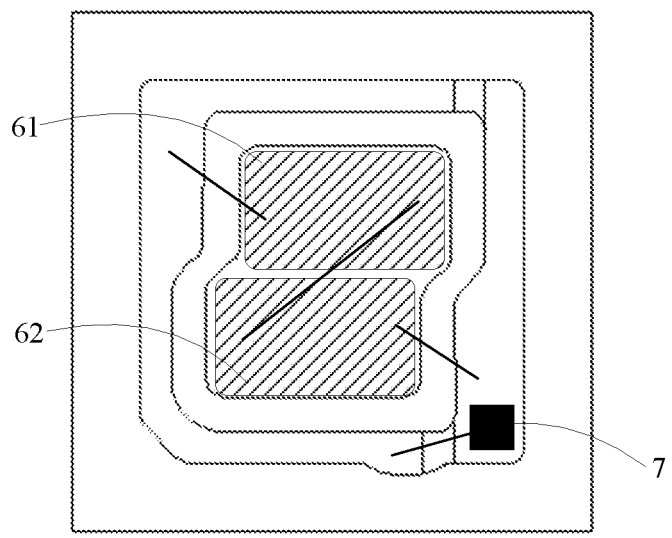
FIG. 12 is a structural schematic diagram of an LED device according to Embodiment 9 of the present disclosure.
Figure 13:
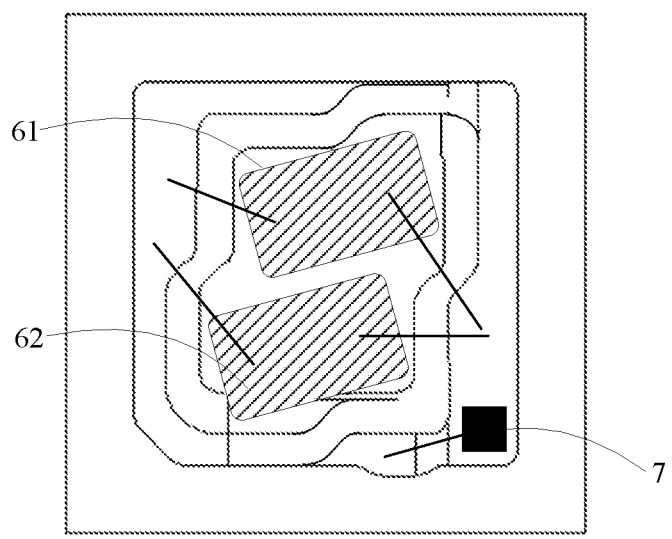
FIG. 13 is a structural schematic diagram of an LED device according to Embodiment 10 of the present disclosure.
Figure 14:
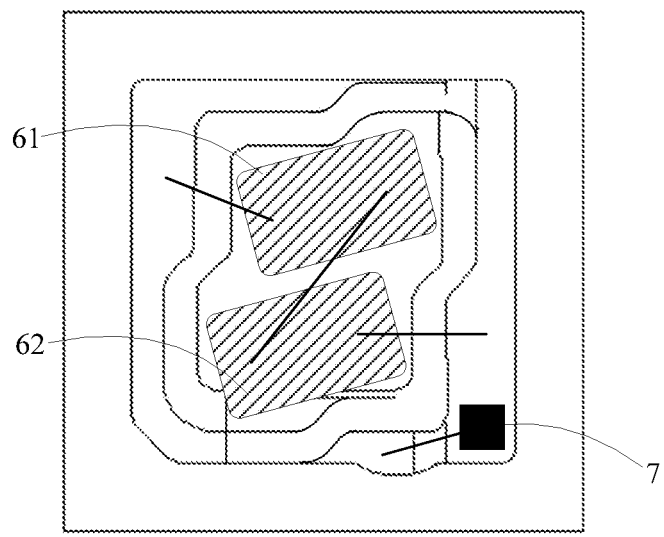
FIG. 14 is a structural schematic diagram of an LED device according to Embodiment 11 of the present disclosure.
Figure 15:
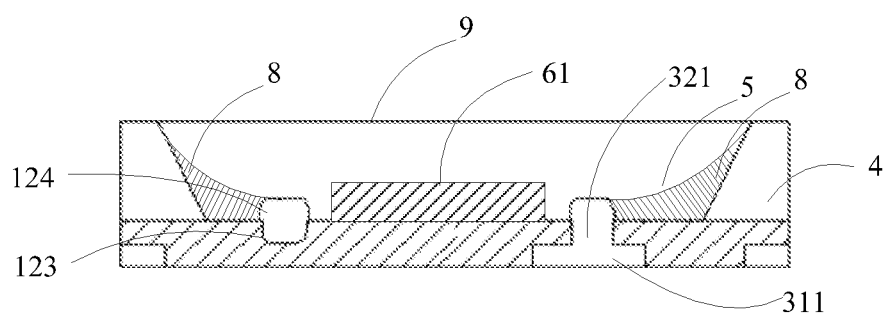
FIG. 15 is a sectional view of an LED device employing the bracket shown in FIG. 5 along the section line B1-B2.

As shown in FIGS. 5, 11 and 15, the LED device includes two LED chips and a bracket having a first reflector cup and a second reflector cup 4. The two LED chips are arranged in a first receiving section 1211 and a second receiving section 1221 of the bracket, respectively. A white light-reflecting layer 8 is filled in a second groove 5 between the first reflector cup and the second reflector cup 4. As a result, the light emitted by the two LED chips may be reflected towards the light-emitting direction of the LED device by the light-reflecting layer 8, thereby improving the luminous intensity and luminous efficiency of the LED device. In addition, a fluorescent layer 9 is coated on an inner side of the first reflector cup, on both LED chips and on the white light-reflecting layer 8.

The white light reflecting layer may be white EMC material.

Preferably, since the first reflector cup is square, semi-circle, or dome-shaped at the top, there is a height difference of 60 μm~120 μm between the top of the first reflector cup and the top of the first photo-etched metal part 1, and the second reflector cup 4 is higher than that of the first reflector cup, the white light-reflecting layer filled in the second groove 5 has a concave-down arcuate surface, thereby increasing the reflecting area of the LED device to further improve the reflectivity of the LED device.

For the LED devices in the embodiments of the present disclosure, since they are produced on the basis of the brackets described above, the relevant contents can be referred to the embodiments of the brackets. The embodiments of the LED devices described above are merely illustrative, which may be understood and implemented by those skilled in the art, without involving any inventive effort.

What has been described above is merely preferred embodiments of the present disclosure and is not intended to be limiting in any way. For this reason, any simple modification, equivalent change and modification to the above embodiments according to the technical spirit of the present disclosure still fall within the scope of the technical solution of the present disclosure, without departing from the contents of the technical solution of the present disclosure.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'include', 'including', 'comprise' or 'comprising' do not exclude other steps or elements.

The invention claimed is:

1. A leadframe, comprising:
a first photo-etched metal part, composed of a first electrode and a chip placement layer stacked thereon, wherein the chip placement layer comprises a first placement zone and a second placement zone connected to each other; wherein the first placement zone has a greater length than that of the second placement zone; wherein a first end of the first placement zone is flush with a first end of the second placement zone so as to together become a first long edge of the chip placement layer; and wherein a second end of the first placement zone and a second end of the second placement zone together become a second edge of the chip placement layer; and wherein the chip placement layer has a greater length for long edges and a greater length for short edges than those of the first electrode; and
a second photo-etched metal part, composed of a second electrode and a connection layer stacked thereon, wherein the connection layer has a greater length for long edges and a greater length for short edges than those of the second electrode;
wherein the first long edge of the chip placement layer is flush with a first long edge of the first electrode, and a first long edge of the connection layer is flush with a first long edge of the second electrode, so that a first isolation trench is formed between the first electrode and the second electrode, and a second isolation trench is formed between the chip placement layer and the connection layer; and
wherein the chip placement layer and the connection layer are respectively provided with L-shaped pins at corners of their respective first long edges to cover sidewalls of the corresponding corners.

2. The leadframe of claim 1, wherein an upper surface and/or a lower surface of each of the L-shaped pins 41 are roughened.

3. The leadframe of claim 1, wherein the second end of the first placement zone is smoothly connected with the second end of the second placement zone at a corner.

4. The leadframe of claim 1, wherein the connection layer at its first edge is provided with a third protruding part matched with the second edge of the chip placement layer, so that a Zener diode can be placed at the third protruding part.

5. The leadframe according to claim 1, wherein a first receiving section is provided at the second end of the first placement zone and a second receiving section is provided at the second end of the second placement zone; the first receiving section and the second receiving section are incorporated in an unaligned manner to jointly form a chip receiving zone; and
wherein a first groove is provided around the chip receiving zone along a whole periphery, except an edge next to the second isolation trench, and is filled with white EMC (Epoxy molding compound) material to form a reflective wall.

6. The leadframe according to claim 2, wherein a first receiving section is provided at the second end of the first placement zone and a second receiving section is provided at the second end of the second placement zone; the first receiving section and the second receiving section are incorporated in an unaligned manner to jointly form a chip receiving zone; and
wherein a first groove is provided around the chip receiving zone along a whole periphery, except an edge next to the second isolation trench, and is filled with white EMC (Epoxy molding compound) material to form a reflective wall.

7. The leadframe according to claim 3, wherein a first receiving section is provided at the second end of the first placement zone and a second receiving section is provided at the second end of the second placement zone; the first receiving section and the second receiving section are incorporated in an unaligned manner to jointly form a chip receiving zone; and
wherein a first groove is provided around the chip receiving zone along a whole periphery, except an edge next to the second isolation trench, and is filled with white EMC (Epoxy molding compound) material to form a reflective wall.

8. The leadframe according to claim 4, wherein a first receiving section is provided at the second end of the first placement zone and a second receiving section is provided at the second end of the second placement zone; the first receiving section and the second receiving section are incorporated in an unaligned manner to jointly form a chip receiving zone; and
wherein a first groove is provided around the chip receiving zone along a whole periphery, except an edge next to the second isolation trench, and is filled with white EMC (Epoxy molding compound) material to form a reflective wall.

9. The leadframe of claim 5, wherein the first receiving section comprises a first protruding part, provided at one end of the first receiving section adjacent to the second isolation trench; and the second receiving section comprises a second protruding part, provided at one end of the second receiving section remote from the second isolation trench.

10. The leadframe of claim 9, wherein the first groove is composed of a first segment of groove and a second segment of groove; the first segment of groove is provided around a long edge and a short edge of the first receiving section as well as a short edge of the second receiving section, while the second segment of groove is provided along a long edge of the second receiving section; wherein a first end of the first segment of groove is in connection with the second isolation trench, while a second end of the first segment of groove intersects with a first end of the second segment of groove, and an outer corner of the first segment of groove at the second end thereof is connected to an inner corner of the second segment of groove at the first end thereof; and wherein the first segment of groove is filled with white EMC material to form a first reflective wall and the second segment of groove is filled with white EMC material to form a second reflective wall.

11. A bracket, comprising the leadframe according to claim 1, wherein the first isolation trench and the second isolation trench are both filled with EMC material to form a first insulation trench and a second insulation trench, respectively; wherein a reflector cup is provided around the leadframe, and a bottom thereof covers sidewalls of the leadframe and is flush with bottoms of the first electrode and the second electrode.

12. The bracket of claim 11, wherein the second end of the first placement zone is smoothly connected with the second end of the second placement zone at a corner.

13. The bracket of claim 11, wherein the connection layer at its first edge is provided with a third protruding part matched with the second edge of the chip placement layer, so that a Zener diode can be placed at the third protruding part.

14. A bracket, comprising the leadframe according to claim 5, wherein the first isolation trench, the second isolation trench and the first groove are all filled with white EMC material to respectively form a first insulation trench, a second insulation trench and a reflective wall, and a first reflector cup is formed by the second insulation trench and the reflective wall.

15. The bracket of claim 14, wherein the first receiving section comprises a first protruding part, provided at one end of the first receiving section adjacent to the second isolation trench; and the second receiving section comprises a second protruding part, provided at one end of the second receiving section remote from the second isolation trench.

16. The bracket of claim 11, wherein a second reflector cup is provided around the leadframe, and a bottom thereof covers sidewall of the leadframe and is flush with bottoms of the first electrode and the second electrode.

17. The bracket of claim 16, wherein the second reflector cup is located outside of the first reflector cup; and a second groove is formed between the first reflector cup and the second reflector cup which is filled with the white EMC material to form a reflective layer.

18. The bracket of claim 17, wherein a top of the first reflector cup is square, semi-circle or dome-shaped, and there is a height difference of 60 μm~120 μm between the top of the first reflector cup and a top of the first photo-etched metal part.

19. An LED device, comprising two LED chips and the bracket according to claim 11, wherein the two LED chips are arranged in the first placement zone and the second placement zone, respectively.

20. An LED device, comprising two LED chips and the bracket according to claim 14, wherein the two LED chips are arranged in the first receiving section and the second receiving section, respectively.

* * * * *